US011243898B2

(12) United States Patent
Hansson et al.

(10) Patent No.: US 11,243,898 B2
(45) Date of Patent: Feb. 8, 2022

(54) MEMORY CONTROLLER AND METHOD FOR CONTROLLING A MEMORY DEVICE TO PROCESS ACCESS REQUESTS ISSUED BY AT LEAST ONE MASTER DEVICE

(71) Applicant: ARM Limited, Cambridge (GB)

(72) Inventors: Andreas Hansson, Cambridge (GB); Aniruddha Nagendran Udipi, Austin, TX (US); Neha Agarwal, Cambridge (GB)

(73) Assignee: Arm Limited, Cambridge (GB)

( * ) Notice: Subject to any disclaimer, the term of this patent is extended or adjusted under 35 U.S.C. 154(b) by 849 days.

(21) Appl. No.: 14/449,689

(22) Filed: Aug. 1, 2014

(65) Prior Publication Data
US 2016/0034406 A1    Feb. 4, 2016

(51) Int. Cl.
G06F 13/18    (2006.01)
G06F 13/16    (2006.01)
G11C 8/12    (2006.01)

(52) U.S. Cl.
CPC .......... *G06F 13/18* (2013.01); *G06F 13/1663* (2013.01); *G06F 13/1673* (2013.01); *G11C 8/12* (2013.01); *Y02D 10/00* (2018.01)

(58) Field of Classification Search
None
See application file for complete search history.

(56) References Cited

U.S. PATENT DOCUMENTS 4,354,232 A * 10/1982 Ryan ................... G06F 12/0855
365/189.05
4,455,602 A * 6/1984 Baxter, III .............. G06F 13/18
710/39

(Continued)

FOREIGN PATENT DOCUMENTS

CN    1920797 A    2/2007
CN    101356847 A    1/2009
(Continued)

OTHER PUBLICATIONS

UK Combined Search and Examination Report dated Nov. 10, 2015 in GB 1510661.0, 6 pages.
(Continued)

*Primary Examiner* — Daniel C. Chappell
(74) *Attorney, Agent, or Firm* — Nixon & Vanderhye P.C.

(57) ABSTRACT

A memory controller and method are provided for controlling a memory device to process access requests issued by at least one master device, the memory device having a plurality of access regions. The memory controller has a pending access requests storage that buffers access requests that have been issued by a master device prior to those access requests being processed by the memory device. Access control circuitry then issues control commands to the plurality of access regions in order to control the memory device to process access requests retrieved from the pending access requests storage. A query structure is also provided that is configured to maintain, for each access region, information about the buffered access requests in the pending access requests storage, and the access control circuitry references the query structure when determining the control commands to be issued to the plurality of access regions. Such an approach enables significant performance and energy savings to be realized in control of the memory device, without requiring the contents of the pending access requests storage to be directly monitored by the access control circuitry.

22 Claims, 8 Drawing Sheets

(56) References Cited

U.S. PATENT DOCUMENTS

| | | | |
|---|---|---|---|
| 5,325,487 A * | 6/1994 | Au | G06F 13/1673 711/109 |
| 5,870,625 A | 2/1999 | Chan et al. | |
| 7,836,230 B1 * | 11/2010 | Wong | G06F 3/061 710/52 |
| 2003/0167385 A1 | 9/2003 | Lai et al. | |
| 2007/0156958 A1 * | 7/2007 | Misra | G06F 11/1451 711/114 |
| 2007/0162775 A1 * | 7/2007 | Raghuvanshi | G06F 1/3203 713/320 |
| 2008/0126641 A1 * | 5/2008 | Irish | G06F 13/1631 710/112 |
| 2009/0249007 A1 | 10/2009 | Leventhal et al. | |
| 2011/0102447 A1 * | 5/2011 | Lin | H04N 7/012 345/570 |
| 2011/0238941 A1 * | 9/2011 | Xu | G06F 13/1689 711/169 |
| 2012/0331197 A1 * | 12/2012 | Campbell | G06F 13/1631 710/117 |
| 2013/0141450 A1 | 6/2013 | Quennesson et al. | |
| 2013/0150072 A1 * | 6/2013 | Kapoor | H04W 68/04 455/456.1 |
| 2013/0151788 A1 | 6/2013 | Bell, Jr. et al. | |
| 2014/0013052 A1 * | 1/2014 | Sawin | G06F 12/0862 711/122 |
| 2014/0101381 A1 * | 4/2014 | Svendsen | G06F 13/1642 711/105 |
| 2014/0149653 A1 * | 5/2014 | Udipi | G11C 7/04 711/106 |
| 2014/0169517 A1 | 6/2014 | Dinkjian et al. | |
| 2014/0181428 A1 * | 6/2014 | Hsu | G06F 12/00 711/154 |
| 2014/0289467 A1 * | 9/2014 | Svendsen | G06F 12/0895 711/118 |
| 2014/0317360 A1 * | 10/2014 | Campbell | G06F 15/167 711/148 |
| 2015/0134919 A1 * | 5/2015 | Murata | G06F 13/1663 711/151 |

FOREIGN PATENT DOCUMENTS

| | | |
|---|---|---|
| CN | 102006297 A | 4/2011 |
| CN | 102006297 B | 4/2013 |
| CN | 103885892 A | 6/2014 |

OTHER PUBLICATIONS

Liu, J. et al., "RAIDR: Retention-Aware Intelligent DRAM Refresh", (printed on Aug. 1, 2014), 12 pages.

Seshadri, V. et al., "The Evicted-Address Filter: A Unified Mechanism to Address Both Cache Pollution and Thrashing", PACT'12, (Sep. 19-23, 2012), 12 pages.

UK Examination Report dated Aug. 11, 2016 in GB 1510661,0, 2 pages.

Notice of Registration and Search Report for CN Application No. 201510441697.0 dated Nov. 4, 2020 and English translation, 8 pages.

First Office Action for CN Application No. 201510441697.0 dated Dec. 31, 2019 and English translation, 17 pages.

* cited by examiner

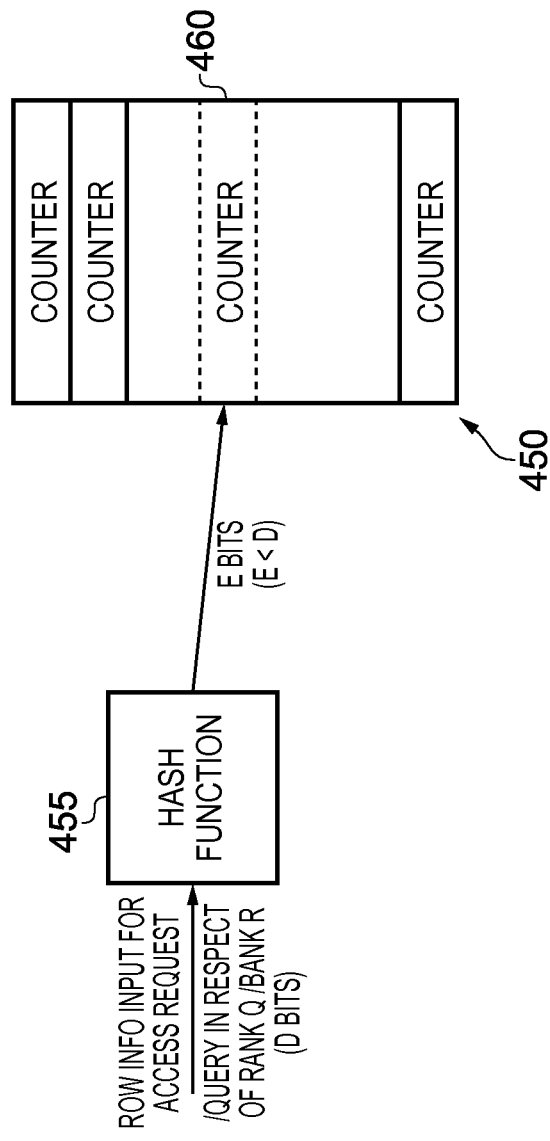

MEMORY CONTROLLER AND METHOD FOR CONTROLLING A MEMORY DEVICE TO PROCESS ACCESS REQUESTS ISSUED BY AT LEAST ONE MASTER DEVICE

BACKGROUND

The present invention relates to a memory controller and memory control method for controlling a memory device to process access requests issued by at least one master device.

In a data processing system, it is known to use a memory controller to control accesses to an associated memory device in order to process access requests issued by master devices within the system. Typically the memory controller will include some storage such as a queue for buffering pending access requests prior to those access requests being processed by the associated memory device.

When controlling the memory device, it is useful to review the pending access requests held within the memory controller's queue, since this can be used to influence the operation of the memory device with the aim of achieving performance improvements, energy savings, etc. For example, with an understanding of what pending access requests there are, it may be possible to place certain parts of the memory device into a low power state without affecting performance of those pending access requests. As another example, it may be more efficient to re-order certain access requests having regards to the mechanisms required to access particular parts of the memory device. For instance, many modern data processing systems use memory devices that have non-uniform access timing requirements, where a particular row needs to be enabled prior to being accessed, and accordingly it is more efficient to perform multiple accesses to the same row whilst that row is enabled, rather than continually switching between different rows.

One type of memory device that exhibits the above property is a memory device comprising a plurality of banks, with each bank comprising a plurality of rows, and with each row needing to be activated prior to that row being accessed. An example of such a memory device is a DRAM (Dynamic Random Access Memory) memory device. However, such non-uniform access timing characteristic are not restricted to DRAM devices and indeed many other types of memory devices have similar bank and row arrangements and associated access timing requirements, for example resistive RAM (ReRAM), magnetic RAM (MRAM), phase change RAM (PCRAM), etc.

From the above discussion, it will be appreciated that there may be various reasons why it would be useful to review the pending access requests in the memory controller's queue when controlling the memory device, whether that be for performing power control operations in respect of the memory device, performing scheduling operations for the pending access requests, or for some other reason. However, as systems become more and more complex, the number of pending access requests that may need to be managed by the memory controller increases, and as a result the associated queue structure for storing those pending access requests is becoming larger. There is hence a significant expense involved in reviewing the contents of the memory controller's pending access requests queue. In a high performance solution, the pending access request queue could be reviewed using some parallel access mechanism so that multiple pending access requests are reviewed in parallel. However, such an approach is complex and results in a significant power consumption, particularly as the size of the queue increases. If instead it were decided to perform the analysis of the contents of the pending access requests queue using a less power hungry, more serial, access mechanism, this will give rise to significant latency issues due to the large number of pending access requests to be reviewed.

It would accordingly be desirable to provide an improved mechanism for controlling the memory device whilst still being able to take account of the pending access requests awaiting processing.

SUMMARY

Viewed from a first aspect, the present invention provides a memory controller comprising: a pending access requests storage configured to buffer access requests issued by at least one master device prior to those access requests being processed by a memory device; access control circuitry configured to issue control commands to a plurality of access regions in the memory device, in order to control the memory device to process access requests retrieved from the pending access requests storage; a query structure configured to maintain, for each access region, information about the buffered access requests in the pending access requests storage; and the access control circuitry being configured to reference the query structure when determining the control commands to be issued to the plurality of access regions.

In accordance with the present invention, the memory device is considered as consisting of a plurality of access regions. The form of the access regions can vary dependent on embodiment, and in particular having regard to the type of access control operations that it is desired to perform on the memory device depending on the pending access requests. For example, when considering power control operations, the access regions may consist of regions that can be subjected to independent power control commands. For scheduling operations performed on the pending access requests, at least some of the access regions may be defined in order to identify groups of addresses that can be accessed more efficiently, for example to take account of the earlier mentioned non-uniform access timing characteristics of many modern memory devices.

In accordance with present invention, in addition to a pending access requests storage that buffers the actual pending access requests awaiting processing by the memory device, a query structure is also provided which is configured to maintain, for each access region, information about the buffered access requests in the pending access requests storage. Whilst the information can take a variety of forms, it is information that can be used to influence the control commands issued by the access control circuitry to the plurality of access regions within the memory device when controlling the memory device to process the pending access requests. Accordingly, the access control circuitry is configured to reference the query structure when determining the control commands to be issued. Since the query structure does not maintain the pending access requests themselves, and instead is configured merely to maintain certain information about the pending access requests, the access control circuitry can obtain suitable information to influence the control commands that it issues much more quickly, and with significantly less power consumption, than would be the case if it sought to analyse the contents of the pending access requests storage directly.

Further, since the query structure is configured to maintain the information for each access region, the access control circuitry can obtain from the query structure information about the pending access requests that relates to a particular access region, thereby obtaining targeted information than can be used to directly determine the appropriate control commands to send to the various access regions when controlling the memory device to process the pending access requests.

Accordingly, the present invention provides a higher performance and lower energy consumption mechanism for controlling a memory device dependent on the pending access requests within the memory controller. With the increasing number of master devices, and increasing bandwidths required in modern systems, the number of pending access requests needing to be maintained by the memory controller is likely to increase, and accordingly the performance and energy saving benefits of the present invention will become more and more significant.

The query structure can take a variety of forms, but in one embodiment comprises information storage configured to store the information for each access region, and maintenance circuitry configured to modify the information associated with one or more access regions as each access request is added to the pending access requests storage, or removed from the pending access requests storage. Such an approach enables the information to be maintained effectively for each of the access regions.

The access regions can take a variety of forms, but in one embodiment each access region comprises a range of memory addresses, and for each access region, the information maintained in the query structure is indicative of whether the buffered access requests include any access requests specifying a memory address within that access region's range of memory addresses. Hence, when considering an appropriate control command to issue to an access region of the memory device, the access control circuitry will be able to retrieve information from the query structure indicative of whether there are any pending access requests directed to a memory address within that access region, this enabling the access control circuitry to make control command decisions that can give rise to significant performance and/or energy savings.

In one particular embodiment, for each access region the information comprises a counter value indicative of the number of buffered access requests that specify a memory address within that access region's range of memory addresses. Such count information assists the access control circuitry in making various control command decisions, such as controlling the power state of particular access regions, deciding on the scheduling of pending access requests to particular access regions etc. For example, if the number of pending access requests in a particular region is relatively high, this may cause the access control circuitry to begin scheduling pending access requests that are directed to that access region, for example to ensure that bottlenecks do not arise that could give rise to quality of service issues.

The query structure can take a variety of forms, but in one embodiment comprises counter value storage configured to store the counter value for each access region, and update circuitry configured, when an access request is added to the pending access requests storage, to adjust in a first direction the counter value associated with each access region whose range of memory addresses includes the memory address specified by that added access request. The update circuitry is further configured, when an access request is removed from the pending access requests storage, to adjust in a second direction opposite to the first direction the counter value associated with each access region whose range of memory addresses includes the memory address specified by that removed access request.

In one particular embodiment, a counter value may be incremented as each access request is added to the pending access requests storage if the memory address specified by that added access request is within the memory address range of the associated access region, and similarly the counter value may be decremented when such an access request is removed from the pending access requests storage, for example when the access request is issued to the memory device by scheduling circuitry within the memory controller.

In one embodiment, the plurality of access regions may comprise a plurality of groups of access regions, and for at least one group of access regions, the query structure is configured to provide information that is shared between multiple access regions in that group of access regions. Hence, for the above-mentioned at least one group of access regions, the information may not be maintained independently for each and every access region within that group, but instead multiple of the access regions may be arranged to share the same information. This can lead to some reduction in absolute accuracy of the information with regards to a particular access region, but can be practical in situations where there is a significant number of access regions within a group, such as is likely to be the case, for example, where one group of access regions is configured such that each separate access region relates to a separate row within a bank of the memory device.

Within such embodiments there are a number of ways in which the information to be shared between multiple access regions can be maintained. In one embodiment, for such a group of access regions the query structure implements a probabilistic update mechanism for the information, an example of such a probabilistic update mechanism being a Bloom filter mechanism. In accordance with a Bloom filter mechanism, an input value consisting of a certain number of bits is subjected to a hash function in order to produce an index value having less bits than the input. The index value will in this instance then point to a particular piece of information. Through such an approach, it will be seen that if the input value to the hash function identifies a particular access region, the index produced by the hash function will not be unique for each individual access region, and indeed multiple access regions will point to the same item of information, for example a counter value.

In one embodiment, the plurality of groups of access regions are arranged as a plurality of hierarchical levels, such that for each access region at one hierarchical level, there are a plurality of associated access regions at a lower hierarchical level. Considering embodiments where each access region comprises a range of memory addresses, it may hence by the case that at a higher hierarchical level each of the access regions covers a relatively large range of addresses, whilst at lower hierarchical levels the individual access regions cover smaller ranges of addresses.

Whilst there are a number of ways in which the information can be maintained for each access region when adopting the above hierarchical level approach, in one embodiment the information maintained in the query structure for that access region is an aggregate of the information maintained in the query structure for the associated access regions at the lower hierarchical level. Accordingly, by way of example, in instances where the information takes the form of a counter value, then the counter value associated with an access region at one hierarchical level may be arranged to be an accumulation of the counter values associated with each of the plurality of access regions at the lower hierarchical level.

In one embodiment, the memory device comprises a plurality of banks, and each bank comprises a plurality of rows. Each bank forms an access region within a group of access regions at one hierarchical level, and each row forms an access region within another group of access regions at a lower hierarchical level.

Furthermore, in one embodiment, the memory device further comprises a plurality of ranks, each rank comprising multiple banks from said plurality of banks. Each rank then forms an access region within a group of access regions at a higher hierarchical level than said one hierarchical level containing access regions for each bank. Accordingly, in such an embodiment, there are three separate hierarchical levels of access regions, a first hierarchical level containing access regions for each rank, the next lower hierarchical level containing access regions for each bank within each rank, and at the next lower hierarchical level each access region being associated with a row within each bank.

Whilst it is often the case that the number of ranks and number of banks within a particular memory device are relatively low, and accordingly maintaining separate information such as counter values for each rank and each bank is readily achievable within a small sized query structure, the number of rows within each bank can be relatively large, and maintaining separate information for each row could lead to a significant increase in the size of the query structure, which would reduce the performance and energy saving benefits available from such a query structure. However, in one embodiment, for the group containing access regions formed from each row, the query structure is configured to provide information that is shared between multiple rows within that group. In particular, in one embodiment the earlier mentioned Bloom filter mechanism may be used to ensure that the number of separate items of information maintained is significantly less than the total number of rows within each bank.

In particular, in one embodiment, in association with the rows in each bank, the query structure maintains a plurality of counter values, the number of counter values being less than the number of rows in each bank, and the query structure employs a hash function to identify from an input value a corresponding counter value within said plurality of counter values, the input value providing a row identifier.

Whilst in one embodiment the input value may solely provide a row identifier, it can in addition be supplemented with attribute information associated with the access request, over and above the row identifier itself. In particular, in one embodiment the attribute information may comprise a quality of service (QoS) indication and/or a master device identifier. The quality of service information can for example be used to flag up any time urgency associated with particular requests, for example any real time requests or requests with a hard deadline Hence, an access request directed to a particular row that is in the form of a real time request will get hashed to a different counter value than a separate access request also directed to the same row but having less associated time constraints. By associating a master device identifier with the input value, it is then possible to determine the numbers of pending requests from different master devices, which can be beneficial in a complex System-on-Chip (SoC) with multiple requesters, for example multiple central processing units (CPUs), multiple graphics processing units (GPUs), etc. Such information can assist in particular with fairness and QoS issues, in addition to general scheduling decisions.

The control commands issued by the access control circuitry can take a variety of forms. In one embodiment, the access control circuitry is configured to perform a scheduling operation to determine an order in which the buffered access requests are to be processed by the memory device, and the control commands issued by the access control circuitry include scheduling control commands issued to the plurality of access regions in order to cause the buffered access requests to be processed in the determined order. The access control circuitry is then configured to reference the query structure when performing said scheduling operation.

In addition, or alternatively, the access control circuitry may be configured to perform a power management operation to control a power state of the access regions during the processing of the access requests by the memory device, and the control commands issued by the access control circuitry include power control commands issued to the plurality of access regions in order to control the power state of each access region. The access control circuitry is then configured to reference the query structure when performing said power management operation.

The pending access requests may be either read access requests or write access requests. In one embodiment, the query structure is configured to store, for each access region, information for the read access requests and information for the write access requests. Hence, in such embodiments separate information is maintained for both read access requests and write access requests. However, in alternative embodiments the information may be combined so that the same information is available independent of whether the access request is a read access request or a write access request.

The pending access requests storage can take a variety of forms, but in one embodiment is configured as a queue storage structure.

Further the memory device itself can take a variety of forms but in one embodiment is a DRAM memory device.

Viewed from a second aspect, the present invention provides a method of controlling a memory device to process access requests issued by at least one master device, the memory device having a plurality of access regions, and the method comprising: buffering, within a pending access requests storage, access requests issued by said at least one master device prior to those access requests being processed by the memory device; employing access control circuitry to issue control commands to the plurality of access regions in order to control the memory device to process access requests retrieved from the pending access requests storage; maintaining within a query structure, for each access region, information about the buffered access requests in the pending access requests storage; and causing the access control circuitry to reference the query structure when determining the control commands to be issued to the plurality of access regions.

Viewed from a third aspect, the present invention provides a memory controller comprising: pending access requests storage means for buffering access requests issued by at least one master device prior to those access requests being processed by a memory device; access control means for issuing control commands to a plurality of access regions in the memory device, in order to control the memory device to process access requests retrieved from the pending access requests storage means; query structure means for maintaining, for each access region, information about the buffered access requests in the pending access requests storage means; and the access control means for referencing the query structure means when determining the control commands to be issued to the plurality of access regions.

BRIEF DESCRIPTION OF THE DRAWINGS

The present invention will be described further, by way of example only, with reference to embodiments thereof as illustrated in the accompanying drawings, in which:

FIG. 8 schematically illustrates the operation of a Bloom filter mechanism for maintaining a reduced set of counters for a series of rows within a bank, in accordance with one embodiment.

DESCRIPTION OF EXAMPLE EMBODIMENTS

Figure 1:
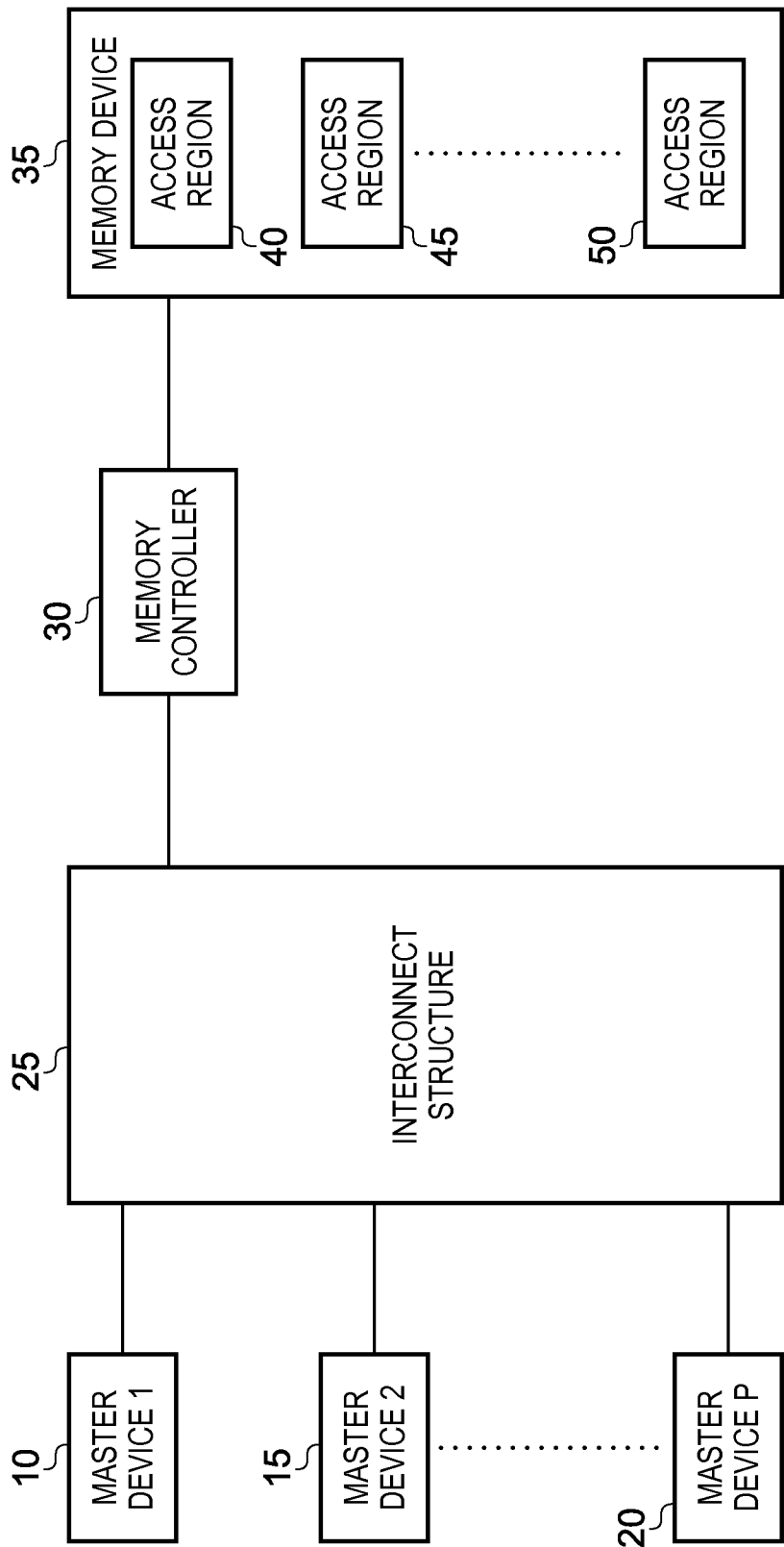
FIG. 1 is a block diagram of a data processing system incorporating a memory controller in accordance with one embodiment.

FIG. 1 is block diagram of a data processing system incorporating a memory controller in accordance with one embodiment. As shown, a variety of master devices 10, 15, 20 are connected via an interconnect structure 25 with a memory controller 30 used to access a memory device 35. The interconnect structure 25 can take a variety of forms, but serves to enable individual access requests issued by the master devices 10, 15, 20 to be routed to the memory controller 30, the memory controller then controlling the memory device 35 to process each access request. For a write access request, this will involve data being written at a specified memory address within the memory device, the memory address being specified as part of the access request issued by the master device. For a read access request, processing of the access request with cause data to be read from the specified memory address within the memory device, with that read data then being returned via the interconnect structure 25 to the appropriate master device.

The master devices 10, 15, 20 can take a variety of forms and hence for examples some master devices may be central processing units (CPUs), one or more may be graphics processing units (GPUs) and other master devices may take other forms, for example network devices. At a minimum there will be a single master device, but it will be appreciated that it is becoming more and more common for the number of master devices within a system to increase. In FIG. 1, it is assumed that there are "P" master devices.

The memory device 35 consists of a plurality of access regions 40, 45, 50. Access control circuitry within the memory controller is able to issue control commands to individual access regions within the memory device 35 in order to control the memory device to process the access requests received from the master devices 10, 15, 20. The control commands can take a variety of forms. For example they may include power control commands in order to place particular access regions in either a fully powered state, or one or more low powered states. Further, those control commands may include scheduling control commands instructing particular access regions to perform certain read and write operations in order to process the access requests received from the master devices.

The memory controller 30 will include a storage structure, typically a queue, for storing pending access requests issued by the master devices, with those pending access requests then being removed from the queue as they are scheduled and issued to the memory device for processing. Within modern data processing systems, as the number of master devices increases, and the bandwidth increases, the number of pending access requests can become significant, and accordingly the pending access requests queue(s) within the memory controllers can be relatively large.

It is very useful for the memory controller to have knowledge about the pending access requests when deciding the appropriate control commands to issue to the memory device, for example the earlier mentioned power control commands and scheduling control commands. However, as the size of the pending access requests queue becomes larger, this can give rise to significant performance and/or energy consumption issues, due to the time taken to analyse the contents of the pending access requests queue and/or the energy consumed in doing so.

Figure 2:
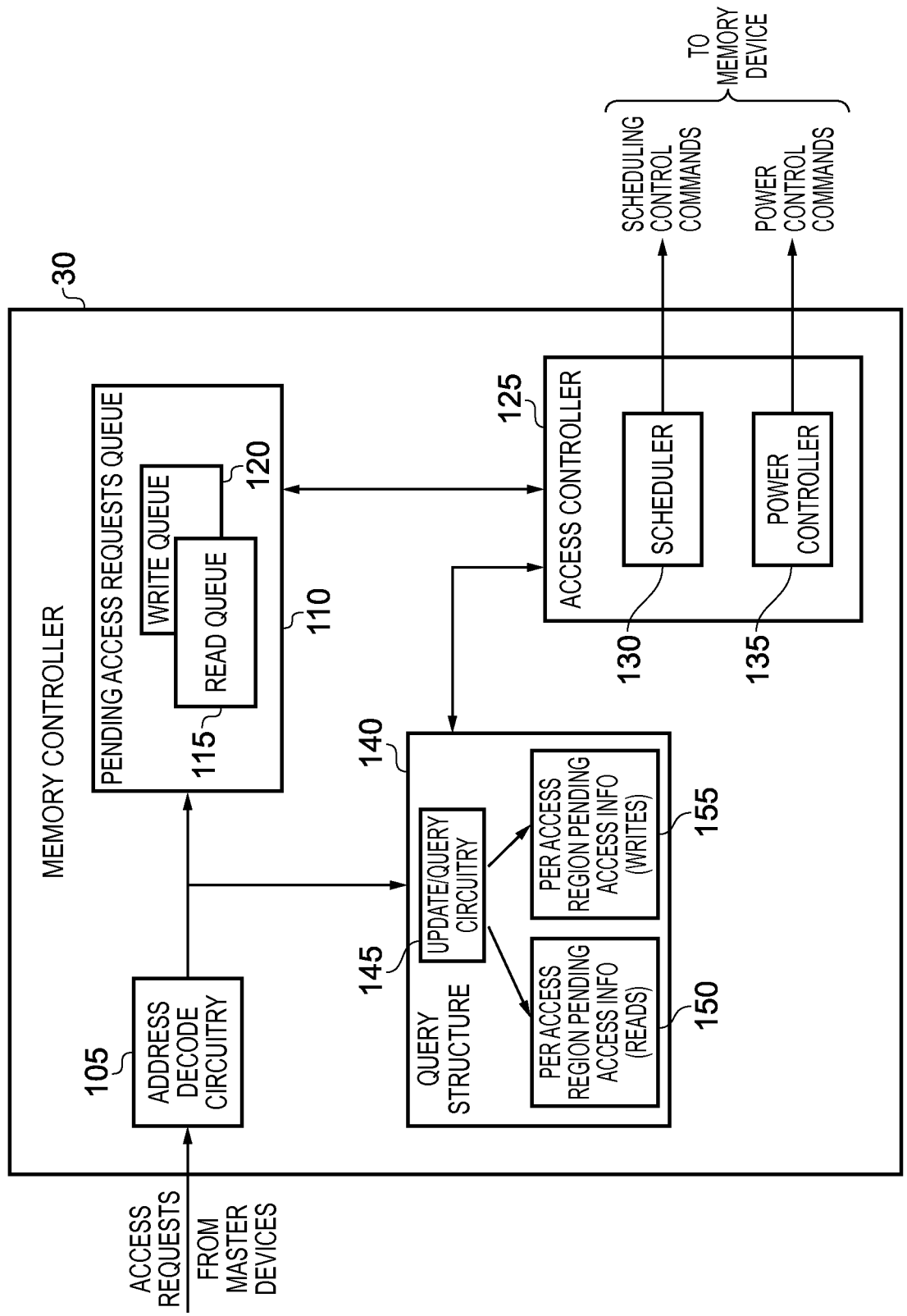
FIG. 2 is a block diagram illustrating in more detail components provided within the memory controller in accordance with one embodiment.

FIG. 2 illustrates a memory controller in accordance with one embodiment, where a separate query structure is used to maintain certain information about the pending access requests within the pending access requests queue, to provide sufficient information to allow the access controller to determine appropriate control commands to issue having regards to the pending access requests, but without the need to analyse the pending access requests queue.

As shown in FIG. 2, the memory controller has address decode circuitry 105 used to perform address decoding operations for each access request. In particular, based on the specified address, that address can be mapped into a particular physical address within the memory device. In one embodiment the memory device is arranged as a plurality of ranks, with each rank having a plurality of banks, and with each bank having a plurality of rows, and the address decode operation can be used to identify the particular rank, bank and row being accessed, and indeed the particular address within a row. This hence provides information about which access region or access regions will be accessed when processing the received access request. In a flat structure where the access regions are mutually exclusive, it will be appreciated that only a single access region will be accessed by a particular access request. However, in one embodiment, the access regions are arranged at a plurality of hierarchical levels, and accordingly in such embodiments each access request may cause multiple access regions to be accessed. For example, considering the earlier configuration of ranks, banks and rows, in one embodiment each rank forms an access region at one hierarchical level, each bank forms an access region at a lower hierarchical level, and each row forms an access region at a yet lower hierarchical level. Hence, within each hierarchical level, one of the access regions will be being accessed when processing the access request, and in particular one rank, a bank within that rank, and a row within that bank, will be being accessed.

The address decoded access request is forwarded on to the pending access requests queue 110 for buffering whilst awaiting issuance of that access request to the memory device by the access controller 125. Each pending access request will be flagged as being either a read access request or a write access request, and as shown in FIG. 2, in one embodiment separate queues 115, 120 are provided for read and write access requests. In the embodiment shown in FIG. 2, only the queues provided for the addresses are shown. It will be appreciated that for a write access request, there will also be a pending write data queue for storing the write data to be written into the memory device. Similarly, for read access requests, there will be an associated read data queue into which the read data obtained from the memory device can be buffered prior to provision back to the relevant master device.

As shown in FIG. 2, a query structure 140 is provided which receives certain of the decoded address information produced by the address decode circuitry 105. In particular, it receives sufficient information to determine which of the access regions is being accessed by a particular request. Hence, considering the earlier example where separate access regions are associated with each rank, bank and row, it will receive the rank, bank and row information for each access request. The update/queue circuitry 145 will then update certain predetermined information maintained within the query structure for each access region. In particular, per access region pending access information is maintained, which in one embodiment takes the form of a counter for each access region identifying the number of pending access requests having specified memory addresses that are within the memory address range of that access region. Whilst the per access region pending access information may be consolidated for both read and writes, in one embodiment, as shown in FIG. 2, separate per access region pending access information 150, 155 is maintained for read access requests and write access requests, respectively.

As each read access request is added to the pending access requests read queue 115 the update circuitry will update the counter information (or other predetermined information) maintained for each access region that is being accessed by that read access request. For a counter, this will typically involve incrementing the counter for each affected access region. Similarly, when the access controller 125 removes an access request from the read queue 115, due to that access request being propagated on to the memory device for servicing, then the update/query circuitry 145 will again adjust the counter information (or other predetermined information) maintained for each affected access region. Typically this will involve decrementing the counter for each affected access region. A similar procedure is employed by the update/query circuitry 145 in respect of the information held in the per access region pending access information block 155 for each write access request added or removed from the pending access requests write queue 120.

The access controller 125 is responsible for sending various control commands to the memory device to control the operation of the memory device whilst processing the various pending access requests. These control commands can take a variety of forms. However, in one embodiment the access controller 125 will contain a scheduler 130 for scheduling the order in which various pending access requests are performed, and for issuing corresponding scheduling control commands to the memory device. In addition, it may include a power controller 135 for controlling the power states of each of the various access regions within the memory device through the issuance of appropriate power control commands.

When performing their various operations, the scheduler 130 and the power controller 135 can optimize the control that they perform based on a knowledge of the pending access requests to be performed. However, as discussed previously, due to the relatively large number of access requests that may be in the queue 110, and hence the relatively large size of the queue, significant energy consumption and/or performance issues arise when seeking to extract that information from the queue 110. Instead, in accordance with one embodiment, the access controller 125 can issue queries via the update/query circuitry 145 of the query structure 140 in order to get pending access information for each access region, and to thereby determine the control commands that they issue accordingly. For example, if the power controller can determine that certain access regions are not targeted by any of the pending access requests, it may be able to place those access regions in a low power state in order to conserve power consumption within the system. Similar, as discussed earlier it is often the case that memory devices have non-uniform access timing characteristics, and that accordingly there can be benefits in performing multiple access requests within a particular access region prior to moving on to performing access requests in other access regions. The per access region pending access information available from the query structure 140 hence enables the scheduler 130 to make appropriate decisions about how to schedule the pending access requests having regards to the access regions being accessed by those pending access requests.

Figure 3:
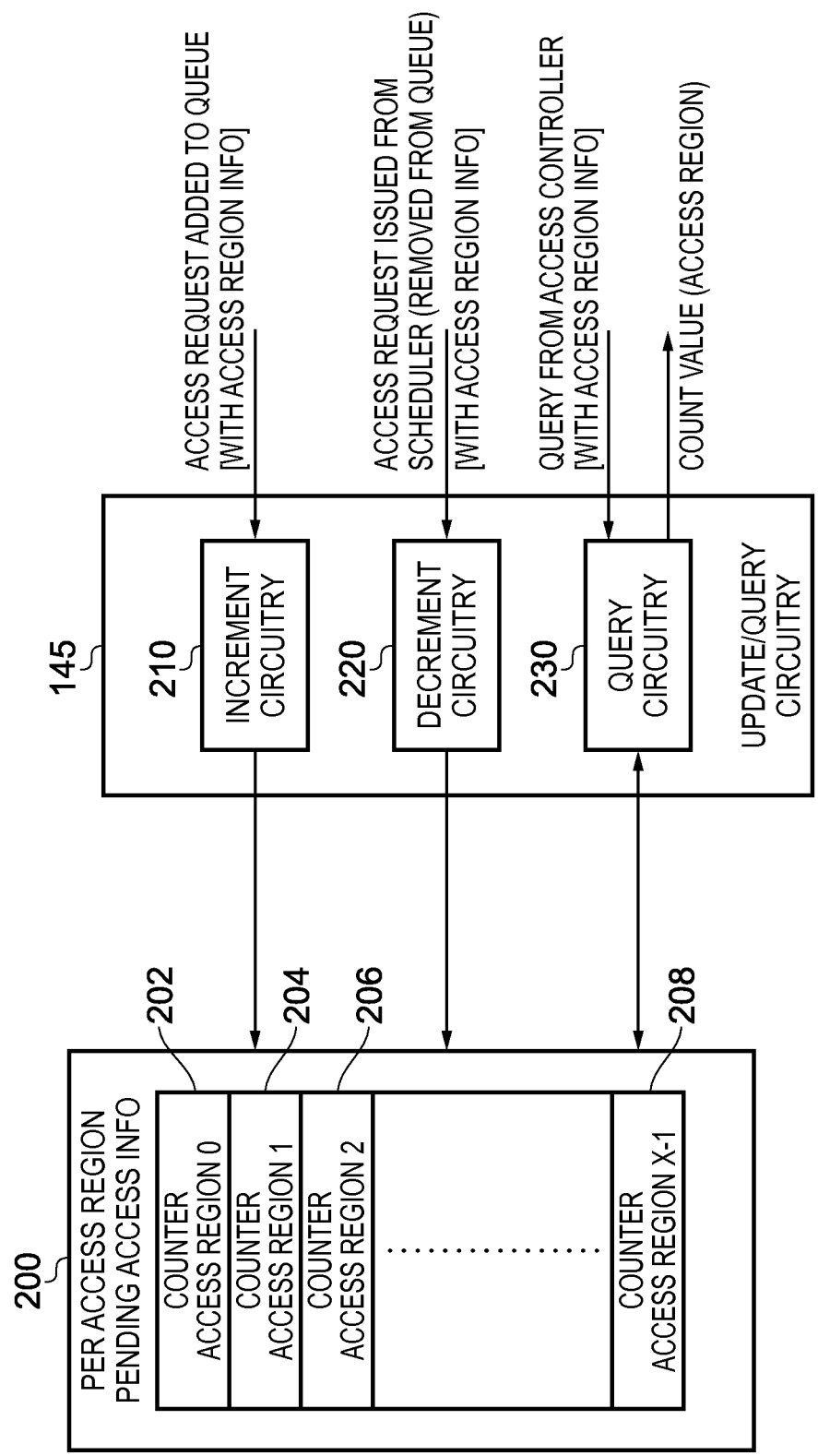
FIG. 3 illustrates in more detail the query structure of FIG. 2 in accordance with one embodiment.

FIG. 3 illustrates in more detail the update/query circuitry 145 of the query structure 140 of FIG. 2, in accordance with one embodiment. For the purpose of illustration only a single per access region pending access information block 200 is shown, which may be maintained for either read access requests, or write access requests, or indeed for a combination of both read and write access requests.

In this example, the per access region pending access information block 200 includes a separate counter 202, 204, 206, 208 for each access region. In this example it is assumed that there are "X" access regions, each having a separate counter maintained within the block 200. Within the update/query circuitry 145 increment circuitry 210 is provided which is responsive to receipt of an indication of each access request added into the pending access requests queue 110, to increment the appropriate counter or counters. In particular, the increment circuitry will receive for each access request an indication of which access region or access regions are being accessed by that access request, and will accordingly increment the appropriate counters.

Similarly, decrement circuitry 220 is provided which is responsive to an indication of each access request as issued from the scheduler, and hence removed from the queue 110, to decrement the appropriate counter or counters. Again, the access region information indicating which access region or access regions will be accessed by that access request is provided to the decrement circuitry, hence enabling the appropriate counters to be decremented.

In addition, query circuitry 230 is provided which is responsive to queries received from the access controller 125 providing access region information, to look up the current counter value for that access region, and then return that value to the access controller 125. This can be used by the scheduler 130 and/or the power controller 135 to influence their scheduling and power control operations and hence influence the control commands issued to the memory device.

Figure 4:
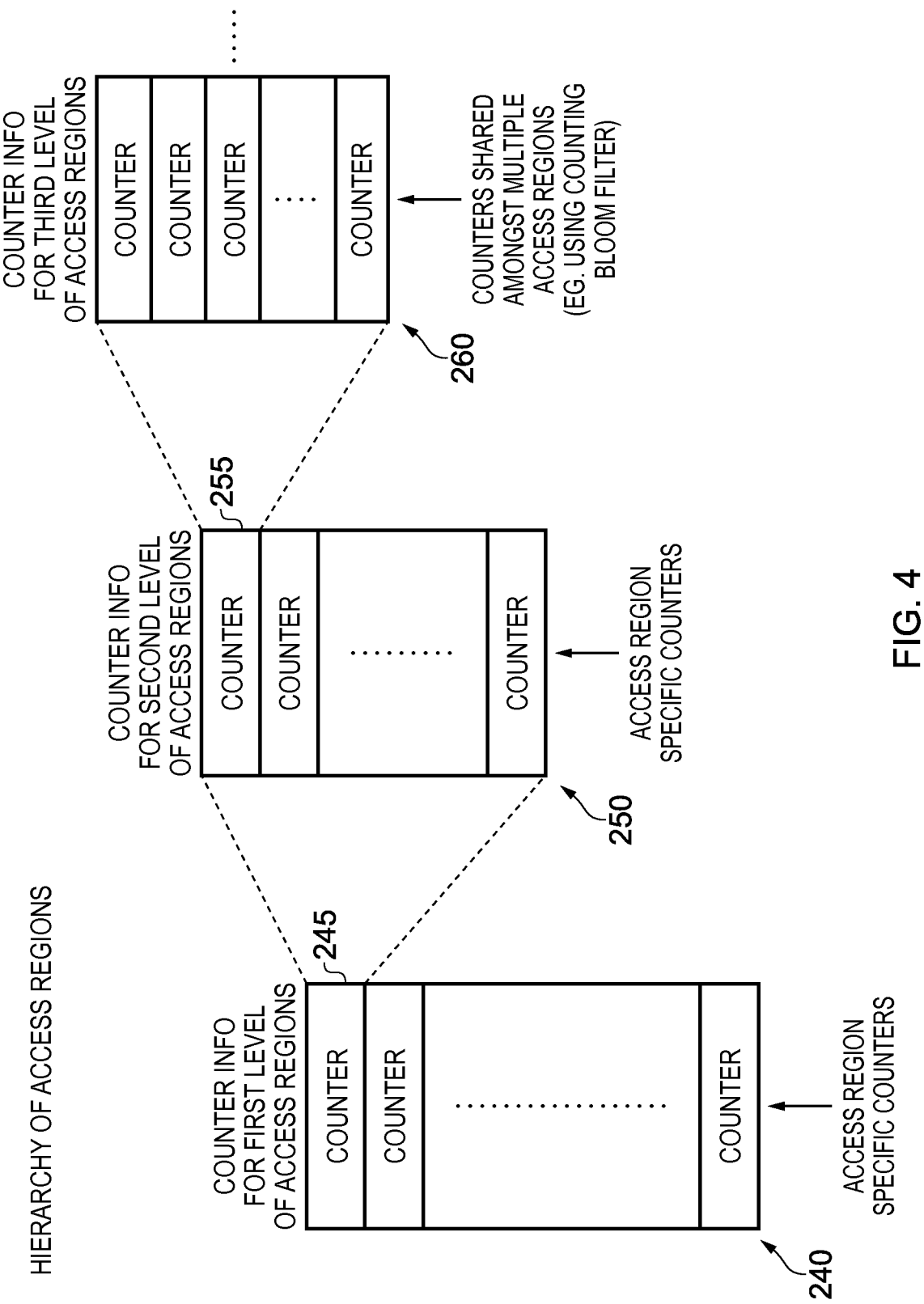
FIG. 4 illustrates how counters may be provided within the query structure for a hierarchy of access regions in accordance with one embodiment.

In one embodiment a flat structure of access regions may be maintained, where each access region relates to a range of addresses not found in any other access region. However, in an alternative embodiment a hierarchy of access regions may be maintained, as illustrated schematically in FIG. 4. In particular, FIG. 4 illustrates how the per access region pending access information may be maintained when the access regions are arranged in a plurality of hierarchical levels. At a highest hierarchical level, a first storage block 240 is provided maintaining separate counters 245 for each access region at that highest hierarchical level. Considering the earlier example of a storage device arranged in ranks, banks and rows, each rank may be considered to be an access region at this highest hierarchical level, with a counter value being maintained for each rank.

At a second level in the hierarchy, another storage block 250 may be provided maintaining separate counters 255 for each access region at that level of the hierarchy. Hence, considering the earlier example of ranks, banks and rows, each bank may form an access region at this level of hierarchy, and be provided with its own separate counter.

In one particular embodiment, the counter value maintained at one level of the hierarchy will be an aggregate of the counter values maintained for the corresponding access regions within the lower level of the hierarchy. Hence, in this example, the value of the counter 245 will be an aggregate of all of the counter values maintained within the storage block 250. Each of the separate counters within the storage block 240 will have a separate corresponding set of counters at the next lowest level in the hierarchy, and again will represent an aggregate of those counter values.

As shown in FIG. 4, this process can be repeated for third and subsequent levels of hierarchy. In particular, a third level of hierarchy is shown having a storage block 260 for maintaining counters associated with access regions at that third level of the hierarchy. Whilst again separate counters could be provided for each access region, it is not essential to store separate counters for each access region, and in some embodiments, at one or more lower levels in the hierarchy it may be more beneficial to store counters that are shared amongst multiple access regions. This is due to the fact that as one progresses through the various levels of access regions, the address ranges associated with the access regions reduces and hence typically the number of individual access regions increases. For instance, considering the earlier example of ranks, banks and rows, whilst the number of ranks within a memory device will be relatively small, and the number of banks within each rank will be relatively small, the number of rows within each bank can actually be very large, and maintaining separate counters for each row of each bank would significantly increase the size of the query structure 140.

To avoid this, in one embodiment a probabilistic update mechanism is used to update the various counters maintained at a particular level in the hierarchy based on the accesses to be performed to the access regions, but where the number of counters maintained is less than the number of separate access regions at that level. There are a number of mechanisms that can be used, but in one embodiment a Bloom filter mechanism is used, where an input value (such as a row identifier) is subjected to a hash function in order to produce an index into the series of counters maintained in the storage block 260. Due to the nature of the hash function, multiple different rows will index into the same counter value and hence will share that counter value. Whilst this gives rise to a reduction in accuracy of the information on a per access region basis, it still provides information that can be interpreted on a per access region basis, whilst giving rise to a significant reduction in the size requirements of the query structure.

Figure 5:
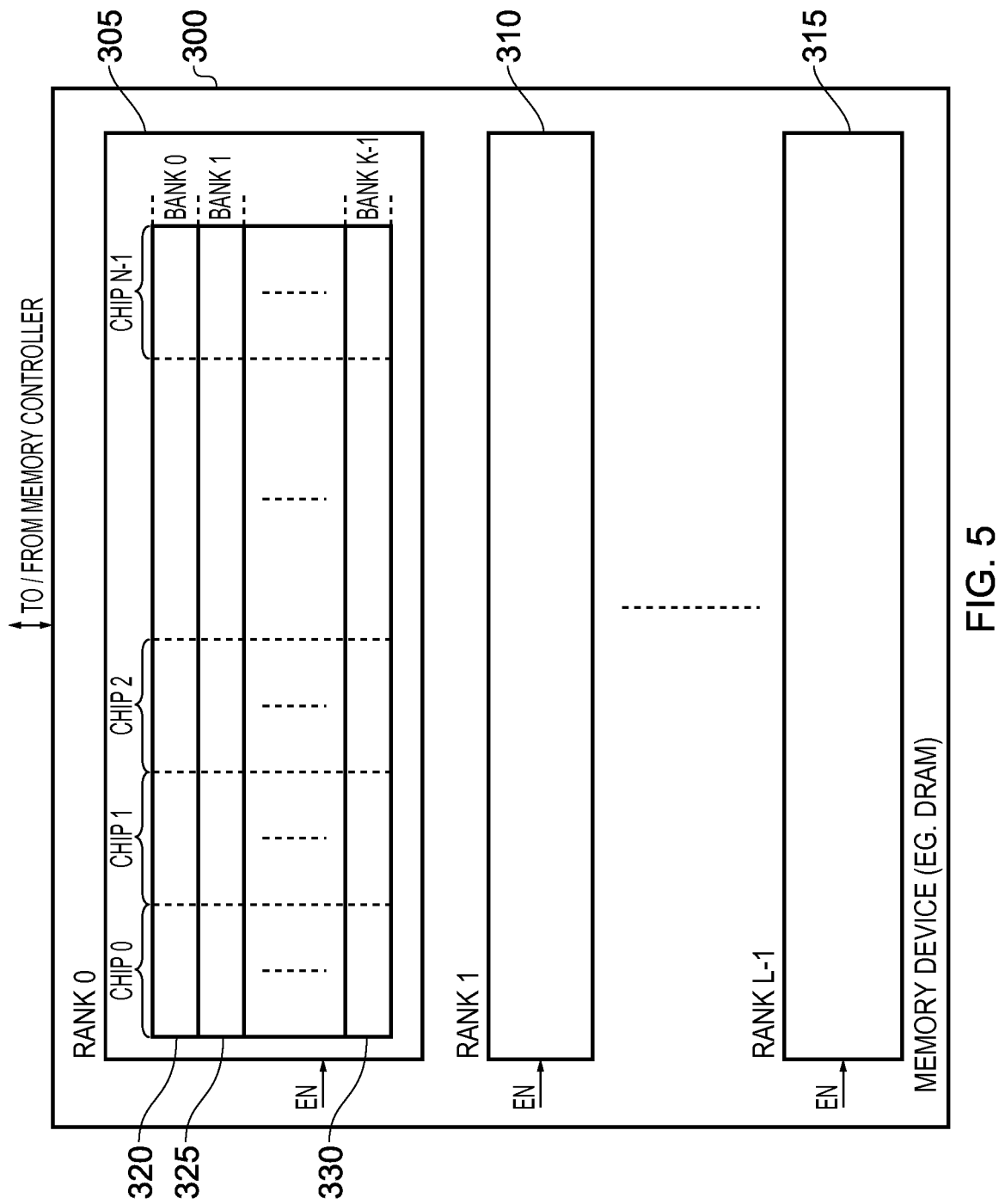
FIG. 5 schematically illustrates the arrangement of a memory device in accordance with one embodiment.

The memory device can take a variety of forms, but in one embodiment takes the form shown in FIG. 5. In this embodiment, the memory device 300 takes the form of a DRAM memory device consisting of a plurality of ranks 305, 310, 315. In this example there are "L" ranks. As shown, each rank can be provided with a separate enable signal, and accordingly the power state of each rank can be varied independently by the power controller 135.

Each rank will typically consist of a plurality of physical chips (in the example shown in FIG. 5 it is assumed that there are "N" chips per rank) and these chips will be arranged so as to provide a plurality of banks 320, 325, 330 per rank. In the illustrated embodiment there are "K" banks per rank.

Each bank will actually consist of a plurality of rows, and indeed there may be several thousand rows within each bank.

Figure 6:
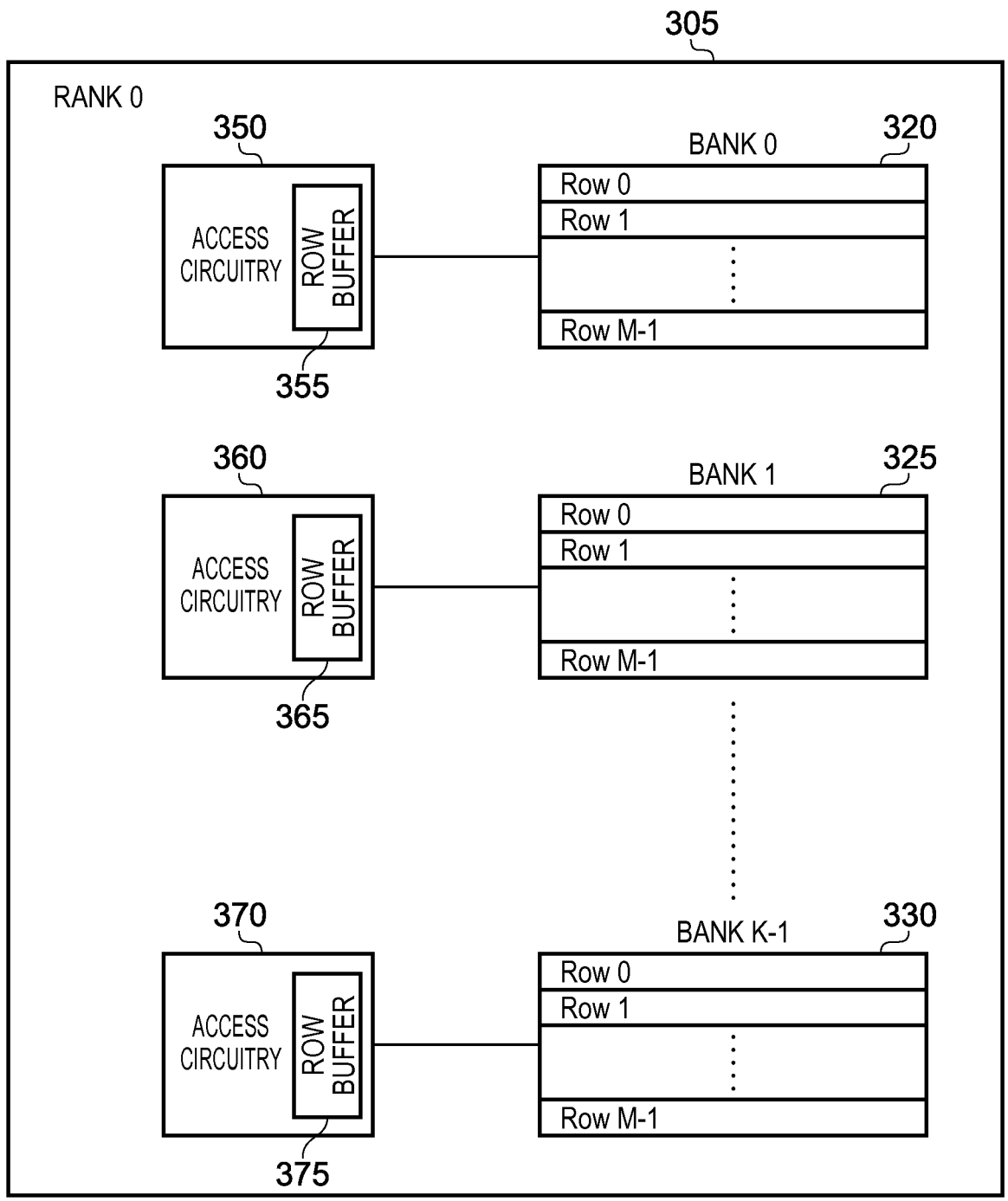
FIG. 6 schematically illustrates the access circuitry provided in association with each bank of a rank of the memory device of FIG. 5, in accordance with one embodiment.

As mentioned previously, a DRAM memory has a non-uniform access timing requirement, which means that once a row has been activated for access, it is beneficial to perform further pending access requests to that row before that row is deactivated and another row activated for access. FIG. 6 is a diagram illustrating access circuitry provided in association with each bank within the rank 305 of the DRAM memory 300 of FIG. 5, in accordance with one embodiment. It is envisaged that each rank will be constructed similarly to that shown in FIG. 6.

As shown in FIG. 6, for each bank 320, 325, 330, there is associated access circuitry 350, 360, 370 which is responsive to scheduling control commands from the scheduler 130 of the memory controller. Each access circuitry 350, 360, 370 includes a row buffer 355, 365, 375, respectively, for storing at least one row of data from the associated bank. In order to access a data value in a row, that row first has to be moved into the relevant row buffer via a RAS command issue from the memory controller, such a RAS command also being referred to herein as an activate command. Once the row has been stored in the row buffer, then individual memory addresses within that row can be accessed via CAS commands issued from the memory controller. Ultimately, when accesses to the row have been completed, or when a new row needs to be accessed, a precharge command is issued from the memory controller to cause the current contents of the row within the row buffer to be stored back into the associated bank within the DRAM.

It will hence be appreciated that there is a significant access time penalty, and indeed a power consumption penalty, incurred when activating a row so that its contents can subsequently be accessed, and accordingly it is beneficial, once a row has been activated and accordingly its contents have been stored within the row buffer, for a plurality of accesses to the memory addresses of that row to then be performed before the row's contents are then subsequently returned to the bank. By using the per access region information maintained by the query structure 140, the scheduler 130 can seek to order pending access requests so as to perform all pending access requests for a particular row whilst that row is still stored in the row buffer of the associated access circuitry, to avoid a row needing to be moved from the bank into the access circuitry and back to the bank multiple times.

Figure 7:
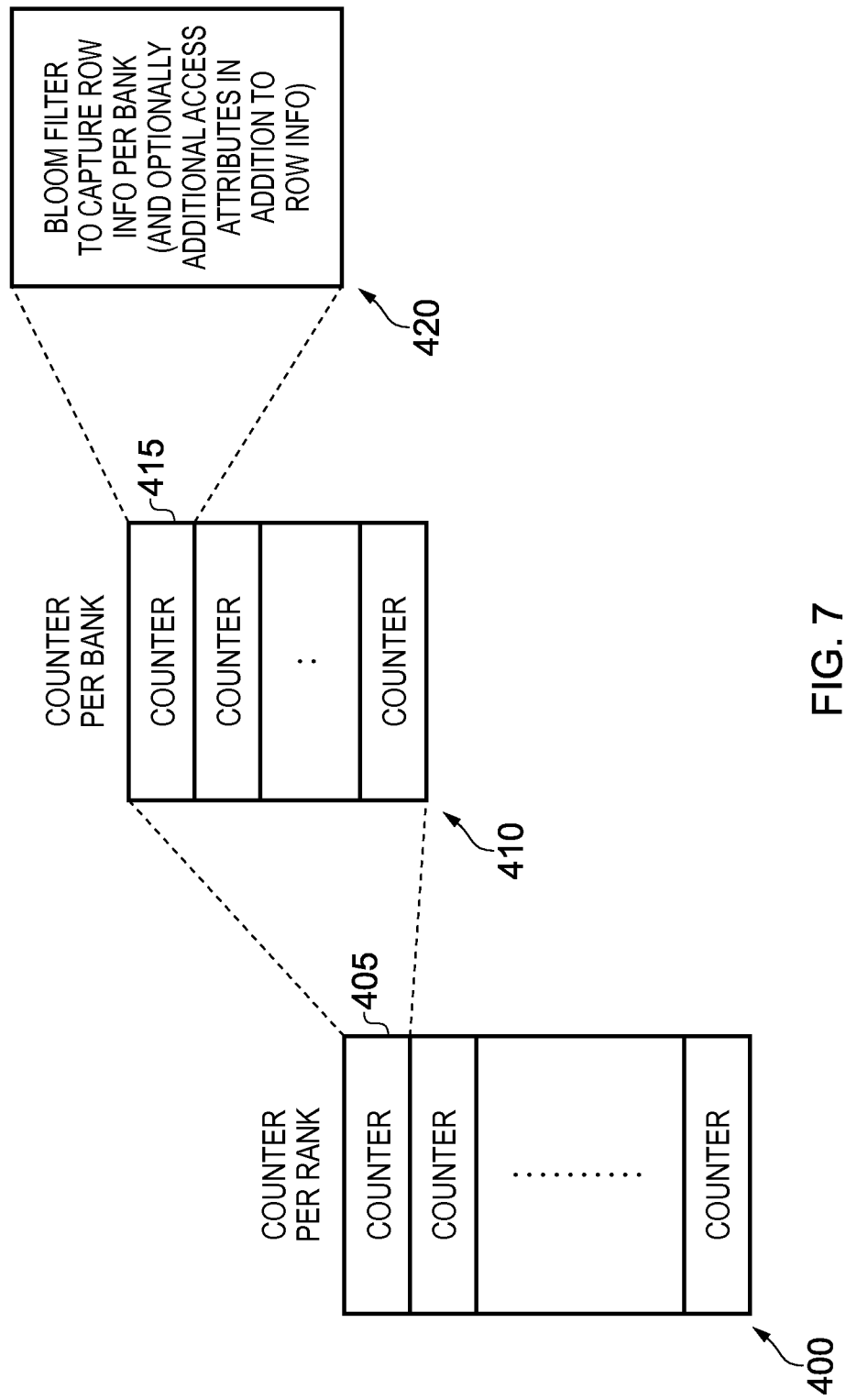
FIG. 7 schematically illustrates the arrangement of the per access region pending access information of the query structure in accordance with one particular embodiment.

FIG. 7 is a version of FIG. 4, specifically showing how the hierarchical levels and associated storage blocks 400, 410, 420 within the query structure may be maintained, in situations where each rank of the memory device forms an access region at a highest hierarchical level, each bank forms an access region at a next hierarchical level, and the rows are then treated as access regions at a yet further lower hierarchical level. Within the block 400 there will be a separate counter 405 for each rank, whilst within the block 410 there will be a separate counter 415 for each bank within a rank.

However, within the storage block 420 there will not be separate counters for each row, and instead in this embodiment a Bloom filter mechanism is used to capture the row information per bank, and optionally additional access attributes in addition to the row information, as will be discussed further with reference to FIG. 8.

As shown in FIG. 8, row information is input to a hash function 455 provided in association with a storage block 450 within the query structure for a particular rank Q and a particular bank R. The structure shown in FIG. 8 will be replicated for each bank within each rank and is used to capture counter information relevant to the rows within that bank. The row information input to the hash function may be due to an access request being added to the pending access requests queue, specifying a particular row within rank Q and bank R, hence requiring an increment of one of the counters 460 within the storage block 450, or may be due to such an access request being removed from the pending access requests queue due to it being scheduled for performance within the memory device, in which case the relevant counter will need to be decremented. Further, the row information may be input as part of a query from the access controller seeking to obtain the current counter value relevant to that row information.

Assuming the row information consists of D bits, the hash function will serve to reduce the number of bits to E bits, where E is less than D. The E bits output by the hash function will be used to index into one of the particular counters 460 within the block 450. For a query from the access controller, the counter value will merely be read and returned to the access controller. For a pending access request added to the pending access requests queue 110, the indexed counter value will be incremented, whilst for a pending access request removed from the pending access requests queue 110, the indexed counter will be decremented.

The row information input to the hash function may in one embodiment consist solely of the row address data. As will be apparent from the operation of the hash function, each counter will be associated with multiple rows.

However, it is not essential to restrict the row information input to only contain the row address data. In particular, it can also include additional attribute data about access requests. For example, it could include certain QoS information identifying quality of service requirements such as whether the access request is a real time access request, a request with a hard deadline, a request with no particular timing constraints, etc. If this information is included within the row information input to the hash function, it will be appreciated that the access request for a particular row will index to different counters dependent on the associated quality of service information. Such information can be useful for the scheduler 130, since the scheduler could for example then query whether there are any access requests associated with a particular row that should be treated as real time access requests. Based on the information returned from the query structure, it can then make appropriate scheduling decisions. As another alternative, or in addition, the row information input to the hash function may also include an identifier for the requesting master device making the access request. This would enable the access controller to query whether there are pending access requests within a particular row for a particular master device, or more generally to issue a series of requests in order to obtain an indication of the number of access requests for a particular master device. Such information can assist particular with fairness and QoS issues in addition to general scheduling decisions.

From the above described embodiments, it will be seen that such embodiments provide a particularly efficient and effective mechanism for guiding the activities of the access controller when controlling a memory device to perform the accesses required by a series of pending access requests. A compact query structure 140 can be maintained for providing pending access information on a per access region basis, in order to guide scheduling and power control operations, along with potentially other operations performed by the access controller, hence enabling more efficient utilisation of the memory device. In addition, the mechanisms of the described embodiments enable this level of control to be achieved without the overhead of seeking to access and analyse the individual pending access requests within the pending access requests queue 110, thereby enabling significant energy consumption savings and performance improvements within the operation of the memory controller.

Although particular embodiments have been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

We claim:

1. A memory controller comprising:
a pending access requests storage configured to buffer access requests issued by at least one master device prior to those access requests being processed by a memory device;
access control circuitry configured to issue control commands to the memory device, in order to control the memory device to process access requests retrieved from the pending access requests storage, the memory device comprising a plurality of access regions, each access region comprising a range of memory addresses;
a query structure configured to maintain, for each access region, count information indicative of a number of currently buffered access requests at a current time specifying a memory address within that access region's range of memory addresses; and
the access control circuitry being configured to reference the query structure so as to take into account, for each access region, the count information indicative of the number of currently buffered access requests at the current time specifying a memory address within that access region's range of memory addresses when determining the control commands to be issued to the memory device.

2. A memory controller as claimed in claim 1, wherein the query structure comprises information storage configured to store the count information for each access region, and maintenance circuitry configured to modify the count information associated with one or more access regions as each access request is added to the pending access requests storage, or removed from the pending access requests storage.

3. A memory controller as claimed in claim 1, wherein for each access region the count information comprises a counter value indicative of the number of currently buffered access requests at the current time that specify a memory address within that access region's range of memory addresses.

4. A memory controller as claimed in claim 3, wherein the query structure comprises:

counter value storage configured to store the counter value for each access region; and update circuitry configured, when an access request is added to the pending access requests storage, to adjust in a first direction the counter value associated with each access region whose range of memory addresses includes the memory address specified by that added access request;

the update circuitry being further configured, when an access request is removed from the pending access requests storage, to adjust in a second direction opposite to the first direction the counter value associated with each access region whose range of memory addresses includes the memory address specified by that removed access request.

5. A memory controller as claimed in claim 1, wherein the plurality of access regions comprise a plurality of groups of access regions, and for at least one group of access regions, the query structure is configured to provide count information that is shared between multiple access regions in that group of access regions.

6. A memory controller as claimed in claim 5, wherein for said at least one group of access regions, the query structure implements a probabilistic update mechanism for the count information that is shared between multiple access regions in that group.

7. A memory controller as claimed in claim 6, wherein the probabilistic update mechanism is a Bloom filter mechanism.

8. A memory controller as claimed in claim 5, wherein the plurality of groups of access regions are arranged as a plurality of hierarchical levels, such that for each access region at one hierarchical level, there are a plurality of associated access regions at a lower hierarchical level.

9. A memory controller as claimed in claim 8, wherein for each access region at said one hierarchical level, the count information maintained in the query structure for that access region is an aggregate of the count information maintained in the query structure for the associated access regions at said lower hierarchical level.

10. A memory controller as claimed in claim 8, wherein:
the memory device comprises a plurality of banks, and each bank comprises a plurality of rows;
each bank forms an access region within a group of access regions at one hierarchical level, and each row forms an access region within another group of access regions at a lower hierarchical level.

11. A memory controller as claimed in claim 10, wherein:
the memory device further comprises a plurality of ranks, each rank comprising multiple banks from said plurality of banks; and
each rank forms an access region within a group of access regions at a higher hierarchical level than said one hierarchical level containing access regions for each bank.

12. A memory controller as claimed in claim 10, wherein for the group containing access regions formed from each row, the query structure is configured to provide count information that is shared between multiple rows within that group.

13. A memory controller as claimed in claim 12, wherein, in association with the rows in each bank, the query structure maintains a plurality of counter values, the number of counter values being less than the number of rows in each bank, the query structure employing a hash function to identify from an input value a corresponding counter value within said plurality of counter values, the input value providing a row identifier.

14. A memory controller as claimed in claim 13, wherein the input value further provides an attribute associated with an access request.

15. A memory controller as claimed in claim 14, wherein said attribute comprises one or more of a quality of service indication and a master device identifier.

16. A memory controller as claimed in claim 1, wherein:
the access control circuitry is configured to perform a scheduling operation to determine an order in which the buffered access requests are to be processed by the memory device, and the control commands issued by the access control circuitry include scheduling control commands issued to the memory device in order to cause the buffered access requests to be processed in the determined order; and
the access control circuitry being configured to reference the query structure when performing said scheduling operation.

17. A memory controller as claimed in claim 1, wherein:
the access control circuitry is configured to perform a power management operation to control a power state of the access regions during the processing of the access requests by the memory device, and the control commands issued by the access control circuitry include power control commands issued to the memory device in order to control the power state of each access region; and
the access control circuitry being configured to reference the query structure when performing said power management operation.

18. A memory controller as claimed in claim 1, wherein the access requests buffered in the pending access requests storage comprises read access requests and write access requests and the query structure is configured to store, for each access region, count information for the read accesses requests and count information for the write access requests.

19. A memory device as claimed in claim 1, wherein the pending access requests storage is configured as a queue storage structure.

20. A memory controller as claimed in claim 1, wherein said memory device is a DRAM memory device.

21. A method of controlling a memory device to process access requests issued by at least one master device, the memory device having a plurality of access regions, each access region comprising a range of memory addresses, and the method comprising:
buffering, within a pending access requests storage, access requests issued by said at least one master device prior to those access requests being processed by the memory device;
employing access control circuitry to issue control commands to the memory device in order to control the memory device to process access requests retrieved from the pending access requests storage;
maintaining within a query structure, for each access region, count information indicative of a number of currently buffered access requests at a current time specifying a memory address within that access region's range of memory addresses; and
causing the access control circuitry to reference the query structure so as to take into account, for each access region, the count information indicative of the number of currently buffered access requests at the current time specifying a memory address within that access region's range of memory addresses when determining the control commands to be issued to the memory device.

22. A memory controller comprising:

means for buffering access requests issued by at least one master device prior to those access requests being processed by a memory device;

means for issuing control commands to the memory device, in order to control the memory device to process access requests retrieved from the pending access requests storage means, the memory device comprising a plurality of access regions, each access region comprising a range of memory addresses;

means for maintaining, for each access region, count information indicative of a number of currently buffered access requests at a current time specifying a memory address within that access region's range of memory addresses; and the means for issuing including means for referencing the means for maintaining so as to take into account, for each access region, the count information indicative of the number of currently buffered access requests at the current time specifying a memory address within that access region's range of memory addresses when determining the control commands to be issued to the memory device.

* * * * *